(12) United States Patent  (10) Patent No.: US 6,982,551 B2
Yates  (45) Date of Patent: Jan. 3, 2006

(54) INTEGRATED CIRCUIT TEST DEVICE

(76) Inventor: Alan G. Yates, 12570 Mt. Hamilton Rd., San Jose, CA (US) 95140

( * ) Notice: Subject to any disclaimer, the term of this patent is extended or adjusted under 35 U.S.C. 154(b) by 0 days.

(21) Appl. No.: 10/764,807

(22) Filed: Jan. 26, 2004

(65) Prior Publication Data

US 2005/0162152 A1    Jul. 28, 2005

(51) Int. Cl.
*G01R 31/02* (2006.01)
(52) U.S. Cl. ............... 324/158.1; 324/755; 324/765
(58) Field of Classification Search ............... 324/755, 324/765, 158.1; 439/66–70, 330–331
See application file for complete search history.

(56) References Cited

U.S. PATENT DOCUMENTS

| 4,554,505 A | * | 11/1985 | Zachry | 324/755 |
| 4,683,423 A | * | 7/1987 | Morton | 324/755 |
| 4,950,980 A | | 8/1990 | Pfaff | 439/296 |
| 5,057,031 A | | 10/1991 | Sinclair | 439/261 |
| 5,147,213 A | | 9/1992 | Funk et al. | 439/266 |
| 5,545,050 A | | 8/1996 | Sato et al. | 439/331 |
| 5,640,303 A | * | 6/1997 | Hooley | 361/699 |
| 5,646,447 A | | 7/1997 | Ramsey et al. | 257/727 |
| 5,766,022 A | * | 6/1998 | Chapin et al. | 439/73 |
| 5,919,050 A | * | 7/1999 | Kehley et al. | 439/71 |
| 5,997,316 A | * | 12/1999 | Kunzel | 439/73 |
| 6,146,178 A | | 11/2000 | Walkup et al. | 439/342 |
| 6,353,329 B1 | | 3/2002 | Kiffe | 324/760 |
| 6,354,859 B1 | * | 3/2002 | Barabi et al. | 439/331 |

* cited by examiner

*Primary Examiner*—Minh N. Tang

(57) ABSTRACT

A test device for testing integrated circuits includes a lid and a base joined at a hinge and secured together with a latch. Within the base is a socket body that electrically connects the integrated circuit under test to the item the socket is mounted to (i.e. load board). Attached to the lid are bearing assemblies. An incline cam that may or may not include arresting points along the incline, rotates on the bearings which are attached to the lid. The cam, which is attached to the handle, translates rotational movement to vertical movement for lowering a pressure plate. This device may allow incremental lowering of a pressure plate by including stop points on the cam.

19 Claims, 3 Drawing Sheets

INTEGRATED CIRCUIT TEST DEVICE

TECHNICAL FIELD

The present invention relates to devices for testing integrated circuits.

BACKGROUND OF THE INVENTION

Integrated circuits are commonly tested before installation. Test sockets are used to determine whether the integrated circuit can make the required electrical connections to pads or leads on the integrated circuit package. This requires an integrated circuit to be placed in the test device under test conditions to allow for both thermal testing of the package and checking terminal connections. Given the high volume of integrated circuits to be tested, it is preferable if the device is adaptable to automation.

U.S. Pat. No. 6,353,329 "Integrated Circuit Test Socket Lid Assembly" to Kiffe discloses a test socket for integrated circuits (ICs). The test socket includes a socket body, allowing electrical connections to be made between the terminals of an integrated circuit and a test board. The socket is mounted in a base that is attached to a lid by a removable hinge. The removable hinge is noted within this reference as the means allowing this device to be adapted to automation. A pressure plate and an actuator for the pressure plate are retained within a frame of the lid by a cover plate. A latch secures the lid to the base. Activation of the actuator exerts force on the pressure plate. An integrated circuit held within the test device is moved to the socket by the pressure plate. The bottom surface of the pressure plate includes a plurality of channels extending from an open central area of the pressure place to the peripheral edges of the pressure plate. This provides some ability to allow air to circulate, although no flow through circulation is possible.

U.S. Pat. No. 5,646,447 "Top Loading Cam Activated Test Socket for Ball Grid Arrays" to Ramsey et al. discloses a socket where an IC package may be inserted and removed. An IC is placed into a hinged lever arm forming a frame around a socket. The base of the socket has a slidable plate having holes with elongated contacts extending into each hole. The socket also has a cam axle and cam handle located opposite the hinged lever arm. When the frame is pressed down, the frame contacts the cam handle, which causes the slidable plate to move, driving the IC contacts into contact with the socket contacts.

U.S. Pat. No. 5,545,050 "IC Socket" to Sato et al. discloses an electrical IC socket which has Y-shaped contact pieces which are more flexible in accommodating a lead from an IC chip, thereby ensuring good contact. The socket has a lid which is spring-biased and, when lowered, pushes the leads against the heads of the contact pieces.

It is an object of the invention to provide a test device for integrated circuits. Ideally, such a test device is adaptable to automation and allows for the thermal testing of integrated circuits. This test device preferably would allow integrated circuit packages of varying height into the test device, allow viewing of the integrated circuit during the test process, provide a means to align the terminals of the integrated circuit, and provide a means to hold the integrated circuit during the test process.

SUMMARY OF THE INVENTION

The above objects have been achieved with a device for testing integrated circuits (ICs). The device includes a base holding a test socket (socket body). The test socket has a means for receiving the terminals (e.g. pad, pins, or other terminals) of an integrated circuit. The lid is joined to the base by a hinge. The lid assembly may be secured by a locking mechanism, that securely holds the lid assembly and base together. A test device, such as an integrated circuit, is held between the lid assembly and base. A pressure plate is retained within the lid assembly. The lid assembly may include a handle, which is fixed to the cam plate. The handle can be rotated a certain distance in either direction, as the handle turns the cam plate also rotates in unison. The lid assembly includes a plurality of fixed bearing assemblies and a cam plate having a circumferential circuit of inclined surfaces, which ride upon the bearing assemblies. As the cam plate moves over the bearing assemblies, the incline along the cam plate forces the cam plate in a downward position. This cam plate subsequently forces the pressure plate in a downward direction. A thrust bearing assembly may or may not be used between the pressure plate and the cam plate to eliminate rotational forces from the cam plate to the pressure plate. Stop points along the incline of the cam plate may consist of notches or grooves which may arrest the bearing assemblies at different points along the incline of the cam plate. The inclined surfaces that make up the cam may or may not terminate in grooves which may or may not be evenly displaced around the cam plate within the lid assembly such that said grooves and inclined surfaces may or may not form a continuous circuit, each groove sized in a method to arrest the bearings assemblies in place. Pressure exerted by the pressure plate on the IC brings the terminals of the integrated circuit into contact with the test socket. Rotating the handle in the opposite direction can subsequently reverse the movement of the cam plate and bring it in an upward direction. The cam plate may or may not be biased against the bearings assemblies by the use of some load, such as spring loading. The cam plate mechanism may also be a cam groove with an incline within a cylindrical, square, or otherwise shaped pressure plate assembly. The pressure plate assembly would be retained in the lid and be the embodiment of the handle, cam plate and pressure plate. As the pressure plate assembly moves over the bearing assemblies, the incline of the cam inside the pressure plate assembly forces the pressure plate assembly in a downward or upward direction, depending on which direction the pressure plate assembly is rotated. A thrust bearing assembly may or may not be used in the pressure plate assembly and may be between the pressure plate assembly and the cam assembly to eliminate rotational forces from the cam assembly to the pressure plate assembly. Stop points along the incline of the cam groove in the assembly may consist of notches or grooves which may arrest the bearing assemblies at different points along the incline of the cam groove within the pressure plate assembly. The inclined surfaces that make up the cam may or may not terminate in grooves which may or may not be evenly displaced around the cam groove within the pressure plate assembly such that said grooves and inclined surfaces may or may not form a continuous circuit, each groove sized in a method to arrest the bearings assemblies in place.

Whichever cam method is used, either a load biased cam plate with inclines, or a cam groove within an assembly, or an embodiment shaped with one or more cam groove cutouts, all of these methods translate rotational movement of the assembly to vertical movement of the assembly.

Numerous shim plates may or may not be used between the pressure plate and cam plate, to offset the pressure plate by a certain distance.

The device may also include stop and start pins, which limits the rotational travel of the handle with respect to the test device. The handle may contain slots or the pressure plate assembly may contain slots, in which the start pins and stop pins attached to the lid of the test socket ride inside of said slots. The start and stop pins may be placed in different areas on the lid to control, arrest, and limit the travel of the handle rotation, such areas were the start and stop pins are on the lid would follow the path of the slot in the handle.

The test device may also include a channel on the pressure plate and/or a channel on the base for viewing of the test device and internal socket parts.

DETAILED DESCRIPTION OF THE INVENTION

The test device of the present invention allows for the testing of integrated circuits. The integrated circuits illustrated in the embodiments have an array of pins (leads) extending from the bottom of the device. However the present test device may accommodate pins, pads or any other terminals on an integrated circuit. If pins are part of the test device (i.e. the device having terminals, the integrated circuit), the socket into which the terminals of the integrated circuit are received may or may not have an array of openings to accommodate the terminals of the integrated circuit device. The socket has some form of conductors that contact the terminals of the integrated circuit. For example a pogo pin socket could be used for such a tester. It is also possible to employ spring contacts, conductive elastomers, stamped metal contacts, or metal foils in the socket to test the integrated circuits.

The test device (integrated circuit) may alternatively include leadless pads. The test socket could use a biased ball array to engage the pads, allowing for the testing of the integrated circuit. The socket would then be designed to accommodate these pads. Either pins, pads, a combination of pins and pads, or any other terminal type could be tested using a designed socket. Both standardized and custom designed sockets for use in the present testers are commercially available from Gold Technologies (San Jose, Calif.) as well as other sources.

Figure 1:
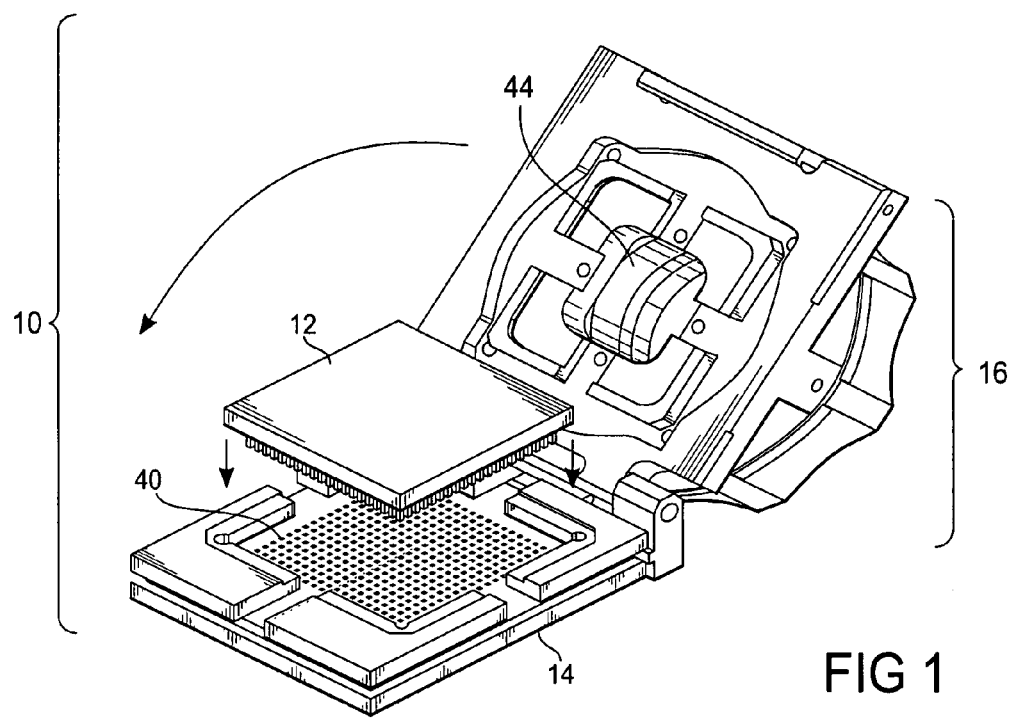
FIG. 1 shows an embodiment of the test device with an integrated circuit to be tested.

In FIG. 1, the test socket 10 features a lid assembly 16 and a base 14. The device under test 12, for instance an integrated circuit, fits into a socket body 40 in the base 14. As will be explained in more detail below, a pressure plate 44 in the lid assembly 16 forces the pins or pads of the device 12 into contact with the socket body 40 when the lid assembly 16 is closed and the pressure plate 44 is activated.

Figure 2:
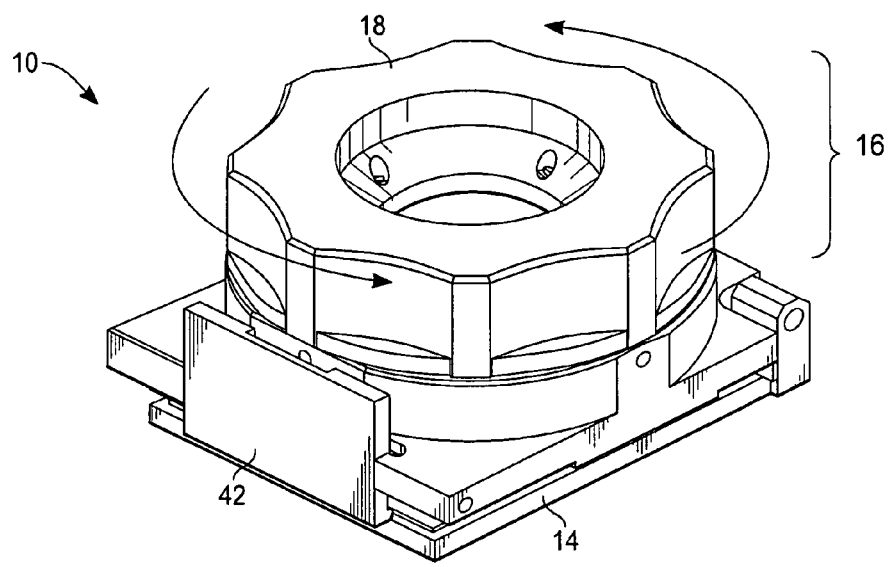
FIG. 2 shows the test socket of FIG. 1 in a closed position.

With respect to FIG. 2, the top of the lid assembly 16 features a rotatable handle 18. The test socket 10 also has a locking mechanism 42, which secures the base 14 and lid assembly 16 in a closed position.

Figure 3:
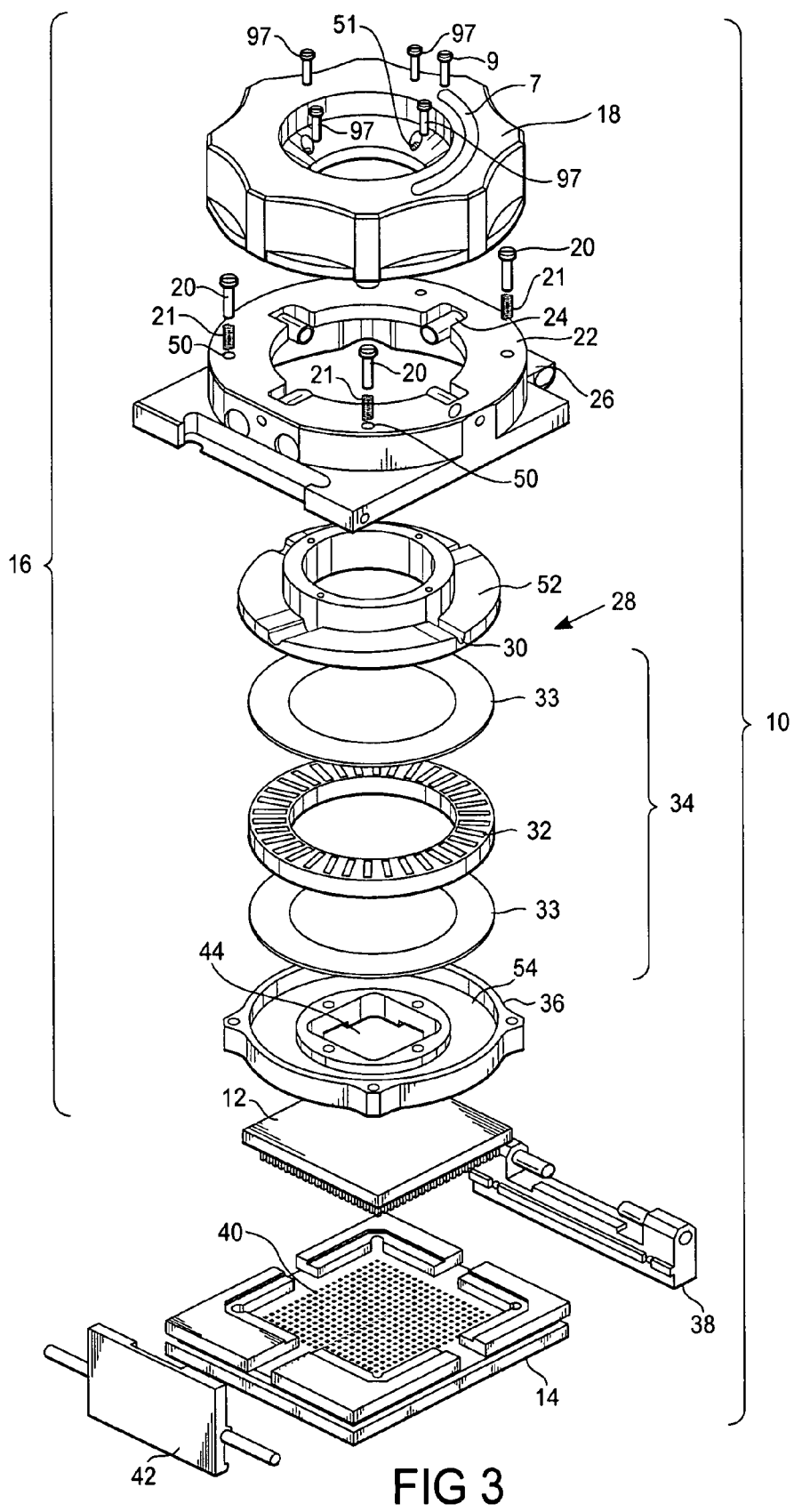
FIG. 3 is an exploded view of one embodiment of the test socket of FIG. 1.
Figure 4:
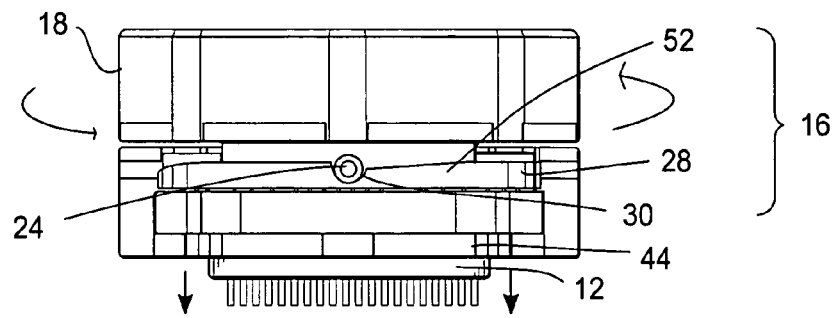
FIG. 4 is a cutaway view showing the operation of the test socket of FIG. 1.

In FIG. 3, one embodiment of the test socket 10 features a base 14 with a socket body 40 for receiving the device 12 under test. The base hinge assembly 38 for connecting the lid assembly 16 and socket body 40 is attached to the base 14. The locking mechanism 42 is secured to the lid 22, for securing the base 14 to the lid assembly 16.

The lid assembly 16 has several components. The rotatable handle 18 forms the top of the lid assembly 16. The handle 18 is above lid 22, which features four fixed bearing assemblies 24 which are spaced apart from each other. (Although this embodiment features four bearing assemblies 24, other embodiments may have a different number of bearings.) The lid hinge mechanism 26 forms part of lid 22 as well.

A cam plate 28 sits below the lid 22. This cam plate 28 features a number of inclined surfaces 52 around the circumference of the cam plate 28. These inclined surfaces 52 are interrupted by grooves 30, which stall the bearing assemblies 24 travel at regular intervals.

The cam plate 28 sits on a thrust bearing assembly 34, which allows the cam plate to rotate freely and independent of the pressure plate housing 36. The handle 18 and cam plate 28 are attached by fasteners such as screws 97. Four threaded fasteners 20 (Although this embodiment features four fasteners 20, other embodiments may have a different number of threaded fasteners) is attached to pressure plate housing 36 and passes through the lid 22. Springs 21 can be placed between the head of the threaded fastener 20 and the lid 22. Lid 22 may have some means of a lid lip to retain the springs 21. The force of the springs 21 between the lid 22 and the head of the threaded fastener 20, pulls the pressure plate 44, thrust bearing assembly 34, and cam plate 28 against the bearing assemblies 24 in the lid 22. In this way, the bearing assemblies 24 are always contacting the cam plate 28 because of the bias of the springs 21. As previously discussed, another way to achieve this means is to use a cam assembly with both top and bottom cam plates to create a cam groove in the cam assembly.

A pin 9 may be inserted through groove 7 on handle 18 and secured into lid 22. If this feature is included the pin acts as a stop pin to limit rotation to the length of groove 7.

The thrust bearing assembly 34 fits in an indentation 54 in pressure plate housing 36. The thrust bearing assembly consists of the thrust bearing 32 and two shims 33. Shims 33 may be placed between the thrust bearing 32 and the pressure plate housing 36, and between the cam plate 28 and thrust bearing 32, to increase the distance of the pressure plate housing 36 with respect to the cam plate 28. The pressure plate 44 is attached, or is part of pressure plate housing 36 and is situated below the pressure plate housing 36. As shown in FIG. 1, the portion of the pressure plate 44 is shaped such that when it comes into contact with the device 12, it will push the pins of the device into the socket body 40. Referring again to FIG. 3, the handle 18 and cam plate 28 are attached by screws 97, which fit in holes 51. Referring again to FIG. 3, threaded fasteners 20 are attached to the pressure plate housing 36, the threaded fasteners pass through lid 22 and springs 21 are between the lid lip 50 and the head of the fastener 20. This means retains the handle 18, cam plate 28 thrust bearing assembly 34, and pressure plate housing 36, in the lid 22, forming the embodiment of the lid assembly 16.

Figure 5:
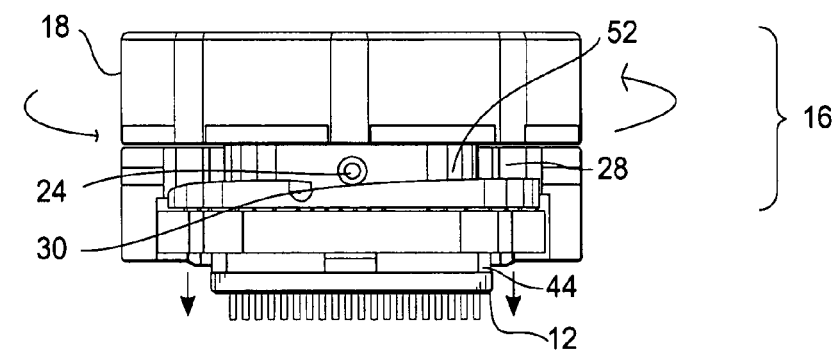
FIG. 5 is a cutaway view showing the operation of the test socket of FIG. 1.
Figure 6:
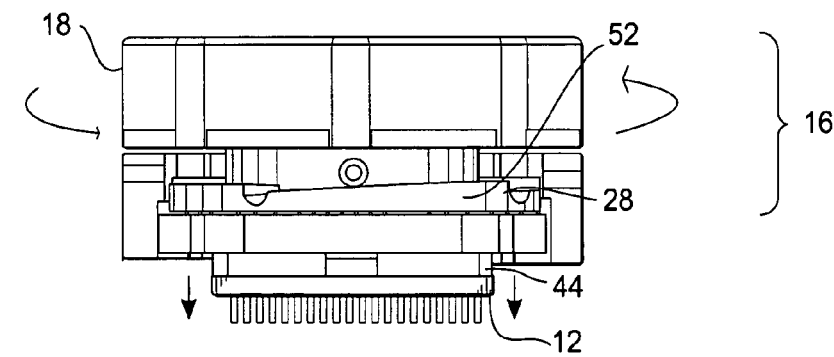
FIG. 6 is a cutaway view showing the operation of the test socket of FIG. 1.
Figure 7:
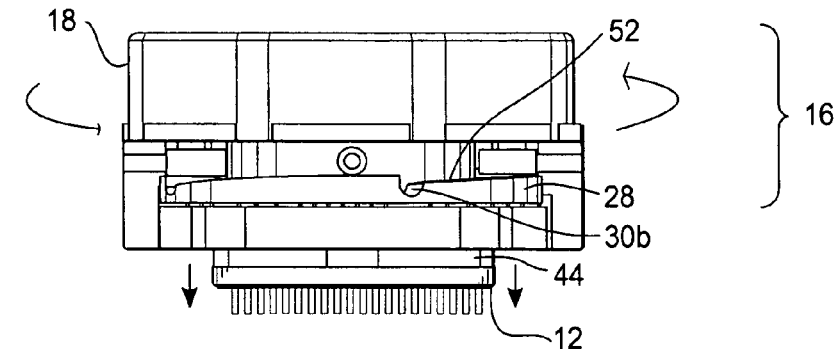
FIG. 7 is a cutaway view showing the operation of the test socket of FIG. 1.

The operation of the embodiment of the test socket shown in FIG. 3 is illustrated in FIGS. 4, 5, 6, and 7. With respect to FIG. 4, when the handle 18 has not been turned, i.e., before the pressure plate 44 has been "activated," the bearing assembly 24 rests in or near a groove 30. In FIG. 5, the handle 18 is rotated slightly. This causes the bearing assembly 24 to leave the groove 30 and begin (relatively) moving up the inclined surface of the cam plate 28 (as shown in FIG. 3, in this embodiment the cam plate 28 is actually rotated when the handle 18 is rotated, because they are attached to each other). Referring again to FIG. 5, as the inclined surface 52 moves relative to the bearing assembly 24, the rotational force of this movement is converted to vertical force and the pressure plate 44 is pushed down. The downward movement of the pressure plate 44 places pressure on the device 12, pushing the device 12 down and into contact with the socket body. In FIGS. 6 and 7, the rotation of the cap handle 18 continues, causing greater displacement of the pressure plate 44. As the pressure plate 44 is pushed downward, the device 12 is brought into closer contact with the socket body until the pins of the device 12 lock into the holes of the socket body.

Another method of achieving the translation of rotational movement to vertical movement is by bringing the pressure plate into contact with the device by rotating the pressure plate housing containing the bearings assemblies within the surface housing. The inclined surfaces are situated in the ceiling of the surface housing. Unlike the embodiment shown in FIG. 3, the bearings assemblies are actually rotated. The embodiments of FIGS. 1–7 may be either manually or robotically activated.

As shown in FIG. 1, both pressure plate 44 and base 14 may or may not include openings or grooves to allow one to access or view the device under test. The opening on pressure plate 44 is at the center of the pressure plate. In addition, sight grooves on the base extend from the sides of the test socket 40 to the exterior of the test device. This channel serves a number of functions. This channel may provide a location for gripping the side of the IC during manual or mechanical insertion or removal of the IC into the test device. This channel also provides a means to access or view the device while the test socket is in the closed position.

A feature of the test socket is incremental mechanical lowering of the pressure plate. An IC may either have pins or pads, and the height of the IC could vary considerably. If the test device has a pressure plate which is lowered a known amount, determined by the mechanical size of the device, the user has a better tool for testing different ICs having differing heights. Shims between the thrust bearing and pressure plate housing can further accommodate the varying height changes of the IC's. In the present device, a cam plate on the lid assembly has an inclined surface extending about the interior circumference of the cam plate. A plurality of grooves along this circumference receives bearing assemblies, which are attached to the lid. A rotating handle engages the cam plate and allows rotation of the bearings assemblies from one groove to the next. This lowers the cam plate a discrete, mechanically defined, incremental distance. The cam plate engages the pressure plate, lowering the pressure plate the same distance.

The present invention may be manufactured out of a durable material, such as metal or thermoplastic.

What is claimed is:

1. A device for testing integrated circuits comprising:
   a) a base;
   b) a socket body within said base for receiving an integrated circuit under test;
   c) a lid assembly including:
      i) a pressure plate within the lid assembly,
      ii) a number of fixed bearing assemblies on the lid assembly,
      iii) a cam plate having a plurality of circumferential inclined surfaces,
      iv) a rotatable handle on the top of the lid assembly for rotating the inclined surfaces on the cam plate relative to the bearing assemblies, whereby the inclined surface of the cam plate rides on the bearing assemblies thereby causing the cam plate to displace and thereby causing the pressure plate to move the integrated circuit into the socket body;
   d) a hinge connecting the base and the lid assembly; and
   e) a locking mechanism for securing the base and lid assembly in a closed position.

2. The device of claim 1, wherein said circumferential inclined surfaces form a continuous circuit.

3. The device of claim 2, wherein said circumferential inclined surfaces terminate in grooves sized to thrust the bearing assemblies in a fixed position.

4. The device of claim 3, wherein said grooves are evenly spaced along said continuous circuit.

5. The device of claim 1, further including a thrust bearing assembly between said pressure plate and said cam plate.

6. The device of claim 1, further including shim plates within said device such that said pressure plate is offset by a height of said shim plates.

7. The device of claim 1, further including stop pins positioned to restrict the rotation of the handle.

8. The test socket of claim 1, further including a sight groove on the base, said sight groove allowing one to view the integrated circuit within said test socket, said sight groove further allowing one to view said sockets internal components.

9. A device for testing integrated circuits comprising:
   a base;
   a socket within said base for receiving a plurality of terminals from an integrated circuit;
   a lid;
   a hinge joining said lid to said base;
   a locking mechanism allowing locking of said lid to said base;
   a pressure plate retained within said lid;
   a means for lowering said pressure plate from said lid to said socket when said integrated circuit is placed within said socket, wherein said means includes a continuous circumferential inclined surface.

10. The device of claim 9, wherein said means for lowering said pressure plate includes a means for incrementally lowering said pressure plate.

11. The device of claim 9, wherein said pressure plate includes an open central area through which the integrated circuit is viewed.

12. A device for testing integrated circuits comprising:
   a base;
   a socket within said base for contacting a plurality of terminals from an integrated circuit;
   a lid;
   a hinge joining said lid to said base;
   a locking mechanism allowing locking of said lid to said base;
   a pressure plate retained within said lid;
   a means for incrementally lowering said pressure plate from said lid to said socket when said integrated circuit is placed within said socket, wherein said means includes a continuous circumferential inclined surface;

a plurality of open channels positioned on said pressure plate to view the integrated circuit.

13. The device of claim 12, wherein said pressure plate includes an open central area through which said integrated circuit is viewed.

14. The device of claim 12, wherein said means includes a continuous circuit of inclined surfaces.

15. The device of claim 14, wherein said inclined surfaces terminate in grooves sized to thrust bearing assemblies of said lid in a fixed position.

16. The device of claim 14, wherein grooves are evenly spaced along said continuous circuit.

17. The device of claim 12, further including a thrust bearing assembly between the pressure plate and the means.

18. The device of claim 12, further including shim plates within said device such that said pressure plate is offset by a height of said shim plates.

19. The device of claim 12, further including stop pins positioned to restrict rotation of said means.

* * * * *